(12) United States Patent
Cowles

(10) Patent No.: US 7,688,118 B2
(45) Date of Patent: *Mar. 30, 2010

(54) REDUCED CURRENT INPUT BUFFER CIRCUIT

(75) Inventor: Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/901,491

(22) Filed: Sep. 18, 2007

(65) Prior Publication Data

US 2008/0012609 A1    Jan. 17, 2008

Related U.S. Application Data

(63) Continuation of application No. 11/357,286, filed on Feb. 17, 2006, now Pat. No. 7,271,628, which is a continuation of application No. 10/928,049, filed on Aug. 27, 2004, now Pat. No. 7,049,861, which is a continuation of application No. 10/230,545, filed on Aug. 29, 2002, now Pat. No. 6,801,061.

(51) Int. Cl.
*H03B 1/00* (2006.01)
*H03K 3/00* (2006.01)

(52) U.S. Cl. .................................... 327/108; 327/112

(58) Field of Classification Search ......... 327/108–112, 327/261–277, 544–547; 326/26–34, 82–92, 326/121; 365/189.05, 227–229

See application file for complete search history.

(56) References Cited

U.S. PATENT DOCUMENTS

| 4,473,762 A | 9/1984 | Iwahashi et al. |
| 5,012,141 A | 4/1991 | Tomisawa |
| 5,121,014 A | 6/1992 | Huang |
| 5,424,672 A | 6/1995 | Cowles et al. |
| 5,508,638 A | 4/1996 | Cowles et al. |
| 5,663,658 A | 9/1997 | Cowles et al. |
| 5,729,504 A | 3/1998 | Cowles et al. |
| 5,745,429 A | 4/1998 | Cowles et al. |
| 5,828,235 A | 10/1998 | Horiguchi et al. |
| 5,864,506 A | 1/1999 | Arculeo et al. |
| 5,936,901 A | 8/1999 | Wong et al. |
| 5,940,315 A | 8/1999 | Cowles et al. |
| 5,945,840 A | 8/1999 | Cowles et al. |
| 5,946,265 A | 8/1999 | Cowles et al. |
| 5,959,929 A | 9/1999 | Cowles et al. |
| 5,995,426 A | 11/1999 | Cowles et al. |
| 5,999,020 A | 12/1999 | Volk et al. |
| 5,999,481 A | 12/1999 | Cowles et al. |
| 6,026,042 A | 2/2000 | Shirley et al. |
| 6,049,245 A | 4/2000 | Son et al. |
| 6,049,502 A | 4/2000 | Cowles et al. |
| 6,094,388 A | 7/2000 | Cowles et al. |

(Continued)

*Primary Examiner*—Lincoln Donovan
*Assistant Examiner*—Diana J Cheng
(74) *Attorney, Agent, or Firm*—Fletcher Yoder

(57) ABSTRACT

There is provided a reduced current input buffer circuit. More specifically, in one embodiment, there is provided an input buffer circuit comprising an input buffer that is adapted to draw an operating current, means for providing a first portion of the operating current to the input buffer, and means for providing a second portion of the operating current to the input buffer if the input buffer is expecting data.

20 Claims, 3 Drawing Sheets

U.S. PATENT DOCUMENTS

| | | |
|---|---|---|
| 6,104,651 A | 8/2000 | Cowles et al. |
| 6,128,237 A | 10/2000 | Shirley et al. |
| 6,141,290 A | 10/2000 | Cowles et al. |
| 6,144,593 A | 11/2000 | Cowles et al. |
| 6,212,114 B1 | 4/2001 | Cowles et al. |
| 6,229,749 B1 | 5/2001 | Cowles et al. |
| 6,253,340 B1 | 6/2001 | Cowles et al. |
| 6,269,035 B1 | 7/2001 | Cowles et al. |
| 6,278,648 B1 | 8/2001 | Cowles et al. |
| 6,285,230 B1 | 9/2001 | Na |
| 6,289,476 B1 | 9/2001 | Cowles et al. |
| 6,310,819 B1 | 10/2001 | Cowles et al. |
| 6,449,203 B1 | 9/2002 | Cowles et al. |
| 6,801,061 B2 | 10/2004 | Cowles et al. |

REDUCED CURRENT INPUT BUFFER CIRCUIT

CROSS-REFERENCE TO RELATED APPLICATIONS

This application is a continuation of U.S. patent application Ser. No. 11/357,286 filed on Feb. 17, 2006, now U.S. Pat. No. 7,271,628, issued on Sep. 18, 2007, which is a continuation of U.S. patent application Ser. No. 10/928,049 filed on Aug. 27, 2004, now U.S. Pat. No. 7,049,861, issued on May 23, 2006, which is a continuation of U.S. application Ser. No. 10/230,545, filed on Aug. 29, 2002, now U.S. Pat. No. 6,801,061, issued on Oct. 5, 2004.

BACKGROUND OF THE INVENTION

1. Field of the Invention

This present invention relates generally to the field of integrated circuit design and, more specifically, to an input buffer circuit that achieves high performance with reduced power consumption.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Computer systems and other electronic devices typically include a variety of electrically interconnected integrated circuit (IC) packages which perform a variety of functions, including memory and processing functions. Many integrated circuit devices have input buffers, which receive data from outside of the integrated circuit. The input buffer is the first stop for data inside the integrated circuit before the data is stored or further processed. Typically, one input buffer is used for each data input of an integrated circuit.

An individual bit of data (a logic high ("1") or a logic low ("0")) may be presented on each of the data input lines. When the data on the input lines has become stable, each bit is transferred into the corresponding input buffer for that data line. A typical method of transferring data from the input lines into the input buffer is through the use of a CLOCK signal. The CLOCK signal is a recurring signal (typically a square wave) that is used to synchronize the operation of a wide range of functions within an integrated circuit. When the data becomes stable on the input lines, the next rising clock edge may be used to signal the input buffer to load the data that is present on the input lines. The data may then be transferred from the input lines into the input buffer itself.

Two important factors in the design of input buffers are power consumption and speed of operation (performance). The relationship between power consumption and performance is a classic design tradeoff. This means that an input buffer that is optimized for performance (high speed) typically consumes much more power than an input buffer designed to save power. Correspondingly, an input buffer that is designed to conserve power typically has slower performance characteristics compared to an input buffer that is designed for high performance.

As computer systems become faster, designers of integrated circuits are striving to produce input buffers that have the fastest performance. Input buffer performance is important because the speed at which an input buffer is able to receive data has a direct impact on the overall speed of the integrated circuit to process information. Unfortunately, designers are also faced with steadily decreasing power consumption requirements. Power consumption goals are being driven down because users of computers and other electronic devices that incorporate integrated circuits are demanding increasingly small package sizes and longer battery life.

One way to reduce input buffer power consumption is to turn power off to the input buffer when it is not in use. A known method is to turn the input buffer completely off after it has latched data and turn it on again prior to latching the next successive data. In input buffers where data is latched on the rising edge of a CLOCK signal, the input buffer is turned off when the CLOCK signal goes high because it is known that the data has been received during the transition of the CLOCK signal from a logic low ("0") to a logic high ("1"). The input buffer may be turned on again when the clock goes low because it is known that the next successive input data for the input buffer will arrive and stabilize when the clock is low in anticipation of being latched when the clock transitions from low to high.

There is, however, a problem with turning the input buffers completely off when the CLOCK signal is high. The problem is that input buffers take time to get ready when power is reapplied to them. If the buffer is not ready when the next successive data input comes in, then the speed at which the incoming data transfers through the input buffer may slow down or incoming data may be lost altogether. Accordingly, an input buffer that offers relatively high performance in terms of operational speed but consumes less power is desirable.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

There is provided a reduced current input buffer circuit. More specifically, there is provided an input buffer circuit comprising an input buffer that is adapted to draw an operating current, means for providing a first portion of the operating current to the input buffer, and means for providing a second portion of the operating current to the input buffer if the input buffer is expecting data.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
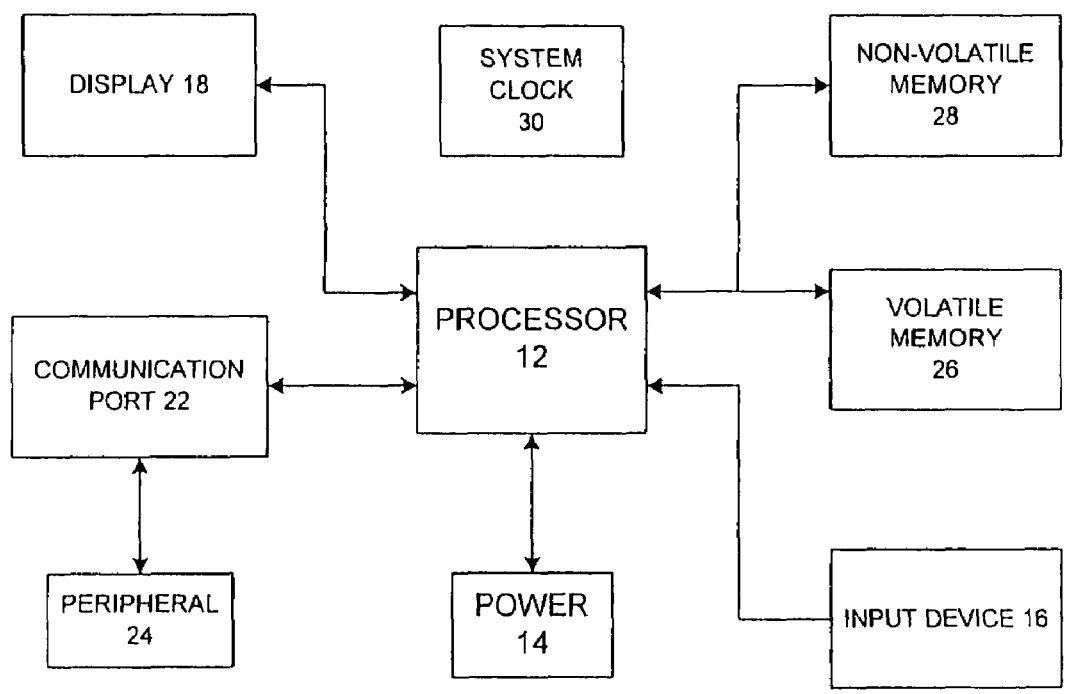
FIG. 1 is a block diagram of an electronic device containing integrated circuit devices that may employ embodiments of the present invention.

Turning now to the drawings, FIG. 1 is a block diagram depicting an exemplary processor-based electronic device, generally designated by the reference numeral 10. The device 10 may be any of a variety of different types, such as a computer, pager, cellular telephone, personal organizer, etc. In a typical processor-based device, a processor 12, such as a microprocessor, executes software to control the operation of the device 10.

The device 10 typically includes a power supply 14. For instance, if the device 10 is portable, the power supply 14 would advantageously include permanent batteries, replaceable batteries, and/or rechargeable batteries. The power supply 14 may also include an AC adapter, so that the device may be plugged into a wall outlet. In fact, the power supply 14 may also include a DC adapter, so that the device 10 may be plugged into a source of DC power such as the cigarette lighter receptacle in a vehicle.

Various other devices may be coupled to the processor 12, depending upon the functions that the device 10 performs. For instance, an input device 16 may be coupled to the processor 12. The input device 16 may include any type of device that allows a user to issue commands to the device 10. Examples of typical input devices include buttons, switches, a keyboard, a light pen, a mouse, and/or a voice recognition system. A display 18 may also be coupled to the processor 12. The display 18 may include an LCD display, a CRT, LEDs, and/or an audio display. A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store the programming and other data. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read-only memory (ROM), such as an EPROM or flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

A system clock 30 may be connected to one or more of the components of the device 10. The connections between the system clock and other devices are not shown in FIG. 1 for purposes of clarity. The details of the connections between the system clock 30 and other components of the device 10 are not crucial aspects of the present invention. Examples of components within the device 10 that may be connected to the system clock 30 include the processor 12, the non-volatile memory 28 and the volatile memory 26.

The processor 12, the non-volatile memory 28 and the volatile memory 26 may be implemented as one or more integrated circuit components. Also, the processor 12, the non-volatile memory 28 and the volatile memory 26 are examples of integrated circuit components that may include input buffers.

Figure 2:
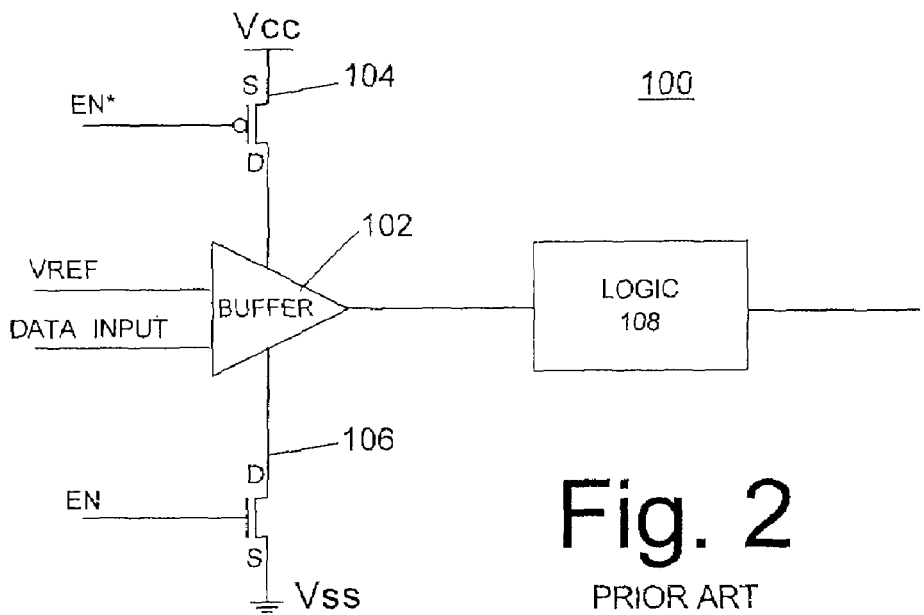
FIG. 2 is a block diagram of a known differential input buffer circuit.

FIG. 2 is a block diagram of a known differential input buffer circuit. The input buffer circuit is generally referred to by the reference numeral 100. In this example, an input buffer 102 includes a $V_{REF}$ INPUT and a DATA INPUT. The buffer 102 is connected to the drain of an enabling p-channel transistor 104 and the drain of a complementary n-channel enabling transistor 106. The source of the enabling transistor 104 is connected to a first supply voltage $V_{CC}$, and the source of the enabling transistor 106 is connected to a second supply voltage $V_{SS}$, which may be ground. The gate of the enabling transistor 106 is adapted to receive an ENABLE signal, which is labeled EN in FIG. 2. The inverse of the ENABLE signal, which is labeled EN* in FIG. 2 is provided to the gate of the enabling transistor 104.

A CLOCK signal (not shown) may be employed to latch data out of the input buffer 102. When the ENABLE signal is high, the enabling transistors 104 and 106 are turned on. In this state, $V_{CC}$ and $V_{SS}$ are provided to the input buffer circuit 100. When enabled, data on the DATA INPUT line may be clocked into the input buffer 102, for example, on the rising edge of the CLOCK signal. The output of the input buffer 102 is coupled to logic 108, which is adapted to receive and process the data received from the input buffer 102.

The differential buffer circuit 100 may be powered down when the ENABLE signal is low. When ENABLE is low, the enabling transistors 104 and 106 are both turned off. Accordingly, $V_{CC}$ and $V_{SS}$ are not supplied to the buffer circuit 100. When the ENABLE signal goes high, the enabling transistors 104 and 106 are turned on. The input buffer 102 may take a relatively long time to stabilize when ENABLE goes high because the voltage levels of circuitry internal to the input buffer 102 cannot be guaranteed. Accordingly, the input buffer circuit 100 may not operate correctly when it is first powered up. The failure of the input buffer circuit 100 to operate correctly may result in decreased system performance or loss of data.

Figure 3:
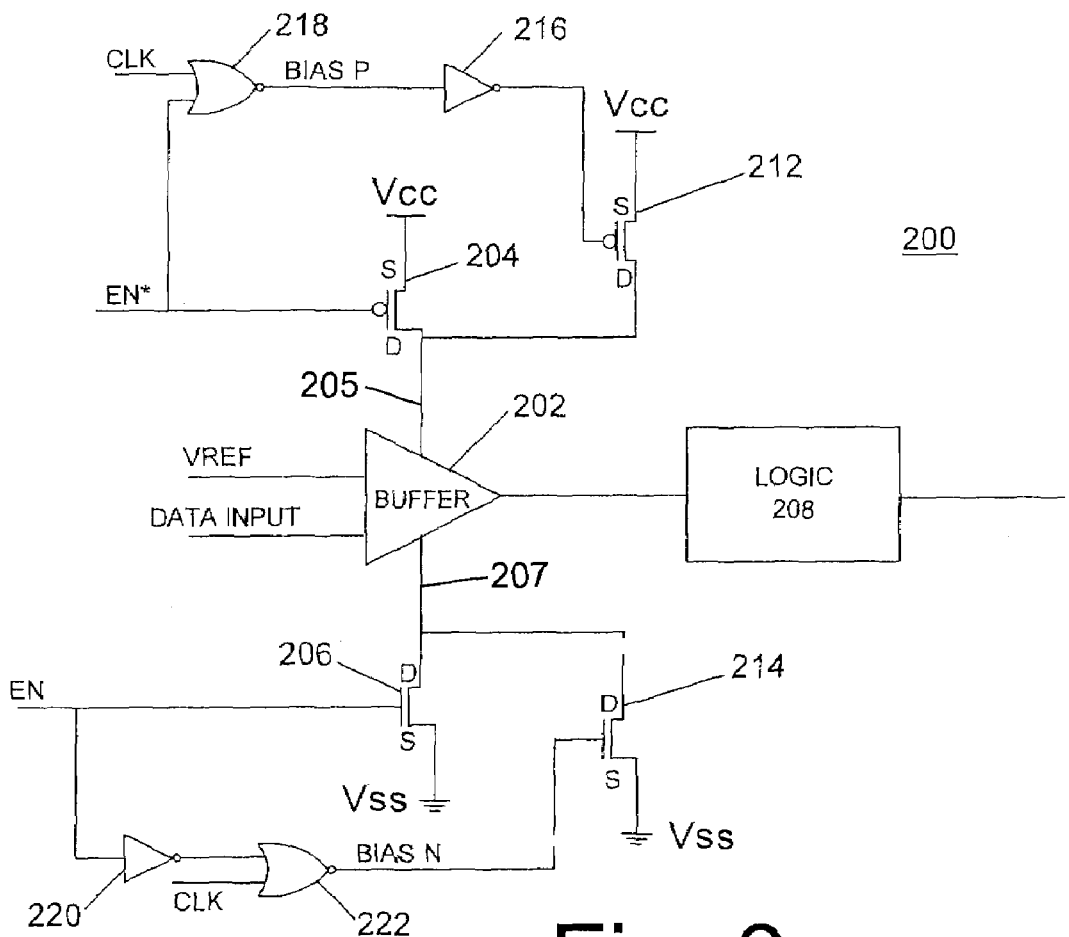
FIG. 3 is a block diagram of an embodiment of a differential input buffer circuit of the present invention.

FIG. 3 is a block diagram of an embodiment of a differential input buffer circuit of the present invention. The differential input buffer circuit shown in FIG. 3 is generally illustrated by the reference numeral 200. In this example, the input buffer 202 includes a $V_{REF}$ INPUT and a DATA INPUT. The buffer 202 is connected to the drain of an enabling p-channel transistor 204 and the drain of a complementary n-channel enabling transistor 206. The source of the enabling transistor 204 is connected to a first supply voltage $V_{CC}$ and the source of the enabling transistor 206 is connected to a second supply voltage $V_{SS}$, which may be ground. The gate of the enabling transistor 206 is adapted to receive an ENABLE signal, which is labeled EN in FIG. 3. The inverse of the ENABLE signal, which is labeled EN* in FIG. 3 is provided to the gate of the enabling transistor 204.

In the embodiment illustrated in FIG. 3, a second set of enabling transistors 212 and 214 is used to control the application of power to the input buffer circuit 200. The use of a second set of enabling transistors results in the creation of two power consumption states for the input buffer 202. In a first low power state, the enabling transistors 212, 214 are turned off. In an operational state, the enabling transistors 212, 214 are turned on. Those of ordinary skill in the art will appreciate that additional sets of enabling transistors may be used to create additional power states.

In the example shown in FIG. 3, the source of p-channel enabling transistor 212 is connected to $V_{CC}$. The drain of the enabling transistor 212 is connected to the drain of the enabling transistor 204. The drain of n-channel enabling transistor 214 is connected to the drain of the enabling transistor 206. The source of the enabling transistor 214 is connected to $V_{SS}$.

A BIAS P signal is used to control the operation of the enabling transistor 212 and a BIAS N signal is used to control the operation of the enabling transistor 214. In this example, the BIAS P and BIAS N signals are created by NORing a CLOCK signal (labeled CLK in FIG. 3) with the inverse of the ENABLE signal EN*. A NOR gate 218 performs this function in the embodiment shown in FIG. 3. The output of the NOR gate 218, which is the BIAS P signal, is delivered to an inverter 216, the output of which is connected to the gate of the enabling transistor 212 to control its operation.

In the embodiment shown in FIG. 3, the ENABLE signal is delivered to an inverter 220 to produce one input to a NOR gate 222. The CLOCK signal provided the other input to the NOR gate 222. The output of the NOR gate 222, which is the BIAS N signal, is delivered to the gate of the enabling transistor 214.

A CLOCK signal, which is labeled CLK in FIG. 3, may be employed to latch data from the input buffer 202. When the ENABLE signal is high, the enabling transistors 204 and 206 are turned on. In this state, $V_{CC}$ and $V_{SS}$ are provided to the input buffer circuit 200. When enabled, data on the DATA INPUT line may be clocked into the input buffer 202, for example, on the rising edge of the CLOCK signal. The output of the input buffer 202 is coupled to logic 208, which is adapted to receive and process the data received from the input buffer 202.

In the embodiment disclosed in FIG. 3, the enabling transistors 204 and 206 are sized to provide a relatively small proportion of the operating current required by the input buffer 202 for normal operation. The enabling transistors 212 and 214 are sized to provide the remainder of the operating current to the input buffer 202. The enabling transistors 204 and 212 are coupled to a power supply node 205 of the input buffer, such that the entire operating current flows through the power supply node 205 when the enabling transistors 204 and 212 are both activated. Similarly, the enabling transistors 206 and 214 are coupled to a power supply node 207 of the input buffer, such that the entire operating current flows through the power supply node 207 when the enabling transistors 206 and 214 are both activated. During normal operation of the input buffer 202, the ENABLE signal may be left high. The ENABLE signal may be placed in a low state when the input buffer is not in operation. When the ENABLE signal is low, the input buffer draws very little current, or no current.

As set forth below, the embodiment shown in FIG. 3 automatically saves power by turning off the enabling transistors 212 and 214 when the CLOCK signal is high. By leaving the ENABLE signal high (except for when the input buffer is not being used) the relatively small proportion of operating current provided by the enabling transistors 204 and 206 maintains the voltage level of the internal nodes of the input buffer in a ready state to ensure that the input buffer 202 will operate correctly when the enabling transistors 212 and 214 are turned on.

When the ENABLE signal is high, the enabling transistors 204 and 206 are turned on regardless of the state of the CLOCK signal. The enabling transistors 212 and 214 are, however, only turned on when the ENABLE signal is high and the CLOCK signal is low. The enabling transistors 212 and 214 are turned off when CLOCK is high or when enable is low. By sizing the enabling transistors 212 and 214 to provide a relatively large proportion of the operating current to the input buffer 202, a relatively large proportion of current (thus, power) that would be consumed by the input buffer 202 is withheld from the input buffer 202 when the enabling transistors 212 and 214 are turned off. For example, a significant proportion of the operating current required by the input buffer 202 is saved during normal operation because that current is withheld from the input buffer 202 when the CLOCK signal is high. By withholding current from the input buffer 202, the enabling transistors 212 and 214 significantly reduce the power consumption by the input buffer 202. No performance is sacrificed because valid data is not expected on the DATA INPUT line until the CLOCK signal goes low. When CLOCK goes low, the input buffer 202 is expecting data and the enabling transistors 212 and 214 are turned on to provide full operating current to the input buffer 202 when the data is clocked in.

Additionally, the enabling transistors 204 and 206 continue to provide a relatively small amount of power to the input buffer 202 as long as ENABLE remains high. The provision of the relatively small amount of power afforded by enabling transistors 204 and 206 ensures correct operation of the input buffer 202 by maintaining the voltage levels inside the input buffer 202 in a ready state.

The actual amount of power saved is proportional to the relative sizing of the enabling transistors 212 and 214 compared to the enabling transistors 204 and 206. For example, if the enabling transistors 212 and 214 are sized to provide 90% of the operating current for the input buffer 202, the power savings will be greater than if the enabling transistors 212 and 214 are sized to provide 70% of the operating current required by the input buffer 202. The relationship of the sizing of the enabling transistors 212 and 214 compared to the enabling transistors 204 and 206 may depend on a number of design factors including the total current required by the input buffer 202, the application of the input buffer 202, the size of the die of the integrated circuit component in which the input buffer 202 is implemented, etc. The exact sizing relationship is not a crucial aspect of the invention.

The amount of power saved is also proportional to the time in which the CLOCK signal remains low. The proportion of time the CLOCK signal remains low is directly related to the duty cycle of the CLOCK signal. Power savings are greater for duty cycles in which the CLOCK signal remains low for a larger proportion of the cycle time.

Figure 4:
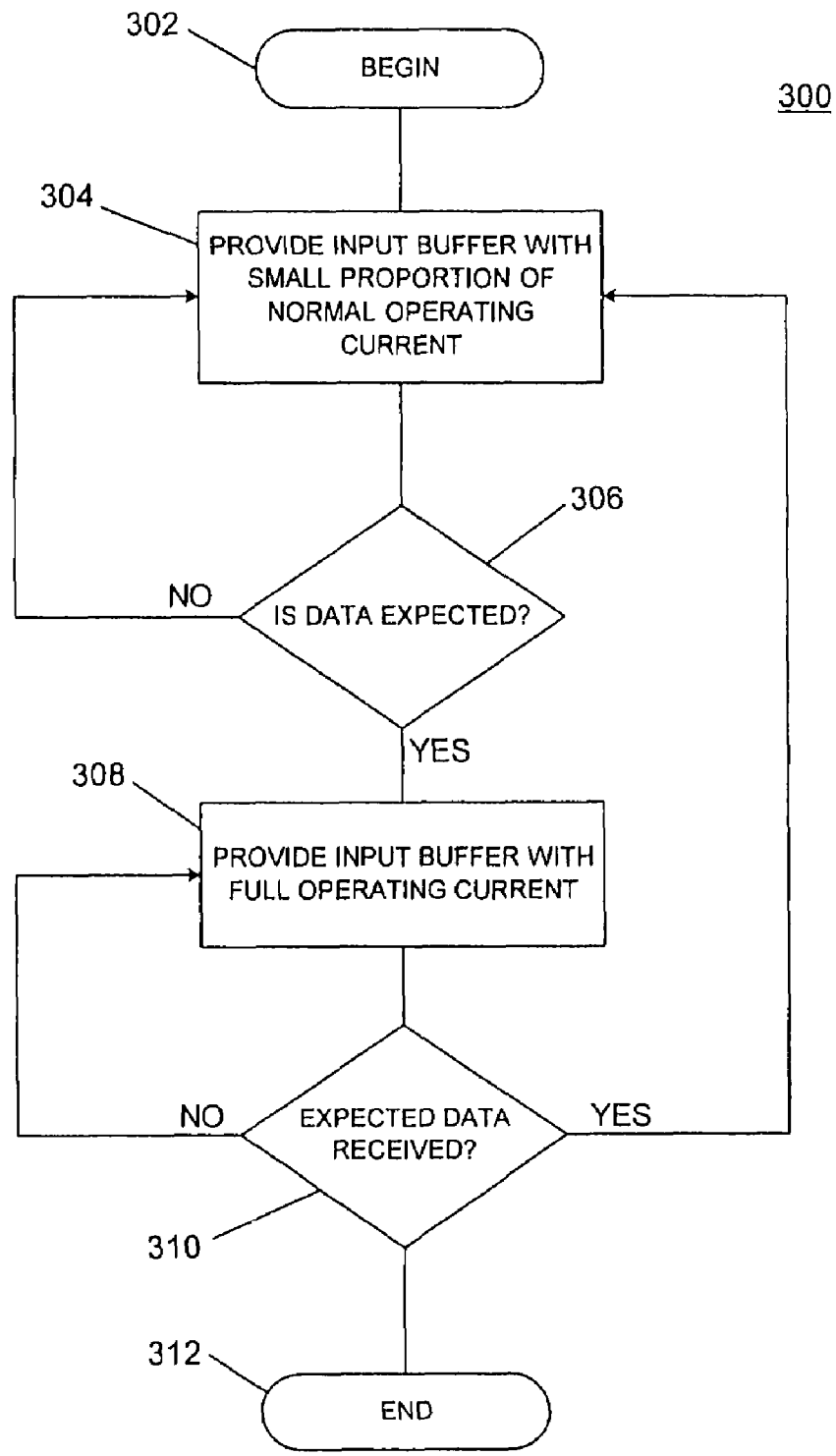
FIG. 4 is a process flow diagram showing the operation of an embodiment of the differential input buffer of the present invention.

FIG. 4 is a process flow diagram showing the operation of an embodiment of the differential input buffer of the present invention. The process is generally referred to by the reference numeral 300. At block 302, the process begins. The beginning of the process may correspond to the powering up of the device 10 (FIG. 1) in which an embodiment of the input buffer circuit of the present invention is implemented. Alternatively, the beginning of the process may correspond to the enabling of the input buffer circuit after a period of non-use.

At block 304, an input buffer is provided with a small proportion of its normal operating current. The small proportion of current provided to the input buffer may be sufficiently large to maintain proper operating levels of the internal circuitry of the input buffer. The small proportion of current is provided to the input buffer until data is expected at the input buffer (see decision block 306). The determination of whether input data is expected may depend on the state of one or more of the control signals associated with the input buffer. For example, if the input buffer is designed to latch data when a CLOCK signal transitions from a logical low to a logical high, the determination that data is expected may be made when the CLOCK signal is low. A low CLOCK signal may indicate that data will be received and latched on the low to high transition.

When data is expected at the input buffer, the input buffer is provided with its full requirement of operating current, as shown at block 308. The input buffer is provided with full operating current until the expected data is received (see decision block 310). When the expected data is received, the input buffer is once again provided with a small proportion of its normal operating current. The determination that data has been received may depend on the state of one or more of the control signals associated with the input buffer. For example, if data is latched on a low to high transition of a CLOCK signal, it may be assumed that data is not expected when the CLOCK signal is in a logical high state. This is true because data cannot be latched when the clock is in a logical high state.

At block 312, the process ends. The ending of the process may correspond to the device 10 (FIG. 1) being shut off. Alternatively, the ending of the process may correspond to the input buffer being placed in a prolonged state of disuse, such as a shutdown state or the like.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An input buffer circuit, comprising:
an input buffer configured to draw an operating current, wherein the operating current is a current sufficient for normal operation of the input buffer;
first buffer enabling circuitry comprising one or more transistors and operatively coupled to a power supply node of the input buffer and configured to cause the input buffer to receive a portion of the operating current when the first buffer enabling circuitry receives an enable signal, wherein the one or more transistors of the first buffer enabling circuitry are responsive to the enable signal; and
second buffer enabling circuitry comprising one or more transistors and operatively coupled to the power supply node of the input buffer and configured to cause the input buffer to receive the operating current when the input buffer is expecting data, wherein the one or more transistors of the second buffer enabling circuitry are responsive to the enable signal.

2. The input buffer circuit of claim 1, wherein the first buffer enabling circuitry causes the input buffer to receive the portion of the operating current during periods of normal operation of the input buffer.

3. The input buffer circuit of claim 1, wherein the input buffer is configured to latch data on a first transition of a CLOCK signal.

4. The input buffer circuit of claim 3, wherein the second buffer enabling circuitry is configured to withhold all but the portion of the operating current from the input buffer responsive to the first transition of the CLOCK signal.

5. The input buffer circuit of claim 3, wherein the second buffer enabling circuitry is configured to cause the input buffer to receive the operating current responsive to a second transition of the CLOCK signal.

6. An input buffer circuit, comprising:
an input buffer configured to draw an operating current, wherein the operating current is a current sufficient for normal operation of the input buffer;
first buffer enabling circuitry comprising one or more transistors and operatively coupled to a power supply node of the input buffer and configured to cause the input buffer to receive a portion of the operating current when the first buffer enabling circuitry receives an enable signal, wherein the one or more transistors of the first buffer enabling circuitry are responsive to the enable signal; and
second buffer enabling circuitry comprising one or more transistors and operatively coupled to the input buffer, the second buffer enabling circuitry being configured to:
cause the input buffer to receive the operating current; and
withhold all but the portion of the operating current from the input buffer when the input buffer is not expecting data;
wherein the one or more transistors of the second buffer enabling circuitry are responsive to the enable signal.

7. The input buffer circuit of claim 6, wherein the first buffer enabling circuitry causes the input buffer to receive the portion of the operating current during periods of normal operation of the input buffer.

8. The input buffer circuit of claim 6, wherein the input buffer is configured to latch data on a first transition of a CLOCK signal.

9. The input buffer circuit of claim 8, wherein the second buffer enabling circuitry is configured to withhold all but the portion of the operating current from the input buffer responsive to the first transition of the CLOCK signal.

10. The input buffer circuit of claim 8, wherein the second buffer enabling circuitry is configured to cause the input buffer to receive the operating current responsive to a second transition of the CLOCK signal.

11. An electronic device, comprising:
a processor;
a power supply configured to provide power to the processor;
a user input device that receives input from a user and provides the input to the processor;
a display device configured to display information;
a volatile memory device comprising an input buffer circuit, the input buffer circuit comprising:
an input buffer configured to draw an operating current, wherein the operating current is a current sufficient for normal operation of the input buffer;
first buffer enabling circuitry comprising one or more transistors and operatively coupled to a power supply node of the input buffer and configured to cause the input buffer to receive a portion of the operating current when the first buffer enabling circuitry receives an enable signal, wherein the one or more transistors of the first buffer enabling circuitry are responsive to the enable signal; and second buffer enabling circuitry comprising one or more transistors and operatively coupled to the power supply node of the input buffer and configured to cause the input buffer to receive the operating current when the input buffer is expecting data, wherein the one or more transistors of the second buffer enabling circuitry are responsive to the enable signal.

12. The electronic device of claim 11, wherein the first buffer enabling circuitry causes the input buffer to receive the portion of the operating current during periods of normal operation of the input buffer.

13. The electronic device of claim 11, wherein the input buffer is configured to latch data on a first transition of a CLOCK signal.

14. The electronic device of claim 13, wherein the second buffer enabling circuitry is configured to withhold all but the portion of the operating current from the input buffer responsive to the first transition of the CLOCK signal.

15. The electronic device of claim 13, wherein the second buffer enabling circuitry is configured to cause the input buffer to receive the operating current responsive to a second transition of the CLOCK signal.

16. An electronic device, comprising:
a processor;
a power supply configured to provide power to the processor;
a user input device that receives input from a user and provides the input to the processor;
a display device configured to display information;
a volatile memory device comprising an input buffer circuit, the input buffer circuit comprising:
an input buffer configured to draw an operating current, wherein the operating current is a current sufficient for normal operation of the input buffer;
first buffer enabling circuitry comprising one or more transistors and operatively coupled to a power supply node of the input buffer and configured to cause the input buffer to receive a portion of the operating current when the first buffer enabling circuitry receives an enable signal, wherein the one or more transistors of the first buffer enabling circuitry are responsive to the enable signal; and
second buffer enabling circuitry comprising one or more transistors and operatively coupled to the input buffer, the second buffer enabling circuitry being configured to:
cause the input buffer to receive the operating current; and
withhold all but the portion of the operating current from the input buffer when the input buffer is not expecting data;
wherein the one or more transistors of the second buffer enabling circuitry are responsive to the enable signal.

17. The electronic device of claim 16, wherein the first buffer enabling circuitry causes the input buffer to receive the portion of the operating current during periods of normal operation of the input buffer.

18. The electronic device of claim 16, wherein the input buffer is configured to latch data on a first transition of a CLOCK signal.

19. The electronic device of claim 18, wherein the second buffer enabling circuitry is configured to withhold all but the portion of the operating current from the input buffer responsive to the first transition of the CLOCK signal.

20. The electronic device of claim 18, wherein the second buffer enabling circuitry is configured to cause the input buffer to receive the operating current responsive to a second transition of the CLOCK signal.

* * * * *